United States Patent
Higashihara et al.

(10) Patent No.: US 8,741,553 B2
(45) Date of Patent: Jun. 3, 2014

(54) AROMATIC HYDROCARBON RESIN, UNDERLAYER FILM FORMING COMPOSITION FOR LITHOGRAPHY, AND METHOD FOR FORMING MULTILAYER RESIST PATTERN

(75) Inventors: Go Higashihara, Kanagawa (JP); Naoya Uchiyama, Kanagawa (JP); Masatoshi Echigo, Kanagawa (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 13/976,611

(22) PCT Filed: Dec. 14, 2011

(86) PCT No.: PCT/JP2011/006979
§ 371 (c)(1),
(2), (4) Date: Jun. 27, 2013

(87) PCT Pub. No.: WO2012/090408
PCT Pub. Date: Jul. 5, 2012

(65) Prior Publication Data
US 2013/0280655 A1 Oct. 24, 2013

(30) Foreign Application Priority Data

Dec. 28, 2010 (JP) .................. 2010-293931

(51) Int. Cl.
*C08G 14/04* (2006.01)
*C08G 8/10* (2006.01)
*G03F 7/11* (2006.01)
*G03F 7/40* (2006.01)
*H01L 21/027* (2006.01)

(52) U.S. Cl.
USPC ........................ 430/323; 430/271.1; 528/143

(58) Field of Classification Search
None
See application file for complete search history.

(56) References Cited

U.S. PATENT DOCUMENTS

| 4,954,607 | A | * | 9/1990 | Otani et al. | .................. 528/230 |
| 5,478,871 | A | * | 12/1995 | Takebe et al. | .................. 523/443 |
| 2010/0316950 | A1 | * | 12/2010 | Oguro et al. | ............... 430/270.1 |

FOREIGN PATENT DOCUMENTS

| CN | 101889247 A | | 11/2010 |
| EP | 1854819 A | * | 11/2007 |
| EP | 2479198 A1 | * | 7/2012 |
| JP | H05-132542 A | | 5/1993 |
| JP | H06-001741 A | | 1/1994 |
| JP | 2000-143937 A | | 5/2000 |
| JP | 2000212255 A | * | 8/2000 |
| JP | 2004-511584 A | | 4/2004 |
| JP | 2004-177668 A | | 6/2004 |
| JP | 2004-271838 A | | 9/2004 |
| JP | 2005-250434 A | | 9/2005 |
| JP | 2008-088197 A | | 4/2008 |
| JP | 2008-292677 A | | 12/2008 |
| WO | 2009/072465 A1 | | 6/2009 |
| WO | WO2011/034062 | * | 3/2011 |

OTHER PUBLICATIONS

English translation of JP 05-132542, A (1993) from machine translation from AIPN Japan Patent Office National center for Industrial Property Information and Training, generated Sep. 22, 2013, 6 pages.*
Naka et al, Abstract of JP 05-132542 A (1993) from SciFinder database accession No. 1993:673021 CAPLUS, three pages.*
English translation of JP 2000-212255, A (2000) from machine translation from AIPN Japan Patent Office National center for Industrial Property Information and Training, generated Sep. 23, 2013, 13 pages.*
International Search Report from the International Bureau of WIPO for International Application No. PCT/JP2011/006979 dated Jan. 17, 2012 and English translation of the same (2 pages).
Office Action issued in corresponding Chinese Application No. 201180063557.4 dated Feb. 21, 2014 and English translation of the same (13 pages).

* cited by examiner

*Primary Examiner* — Cynthia Hamilton
(74) *Attorney, Agent, or Firm* — Fitch, Even, Tabin & Flannery, LLP

(57) ABSTRACT

Provided is an aromatic hydrocarbon resin with a high carbon concentration and a low oxygen concentration that can be used as a coating agent or a resist resin for semiconductors, as well as a composition for forming an underlayer film for photolithography with excellent etching resistance as an underlayer film for a multilayer resist process, an underlayer film formed from the composition, and a method for forming a pattern using the underlayer film. An aromatic hydrocarbon, an aromatic aldehyde, and a phenol derivative are reacted in the presence of an acidic catalyst to yield an aromatic hydrocarbon resin with a high carbon concentration of 90 to 99.9 mass % and a solubility in propylene glycol monomethyl ether acetate of 10 mass % or more.

12 Claims, No Drawings

AROMATIC HYDROCARBON RESIN, UNDERLAYER FILM FORMING COMPOSITION FOR LITHOGRAPHY, AND METHOD FOR FORMING MULTILAYER RESIST PATTERN

CROSS-REFERENCE TO RELATED APPLICATIONS

This application is a U.S. national phase application filed under 35 U.S.C. §371 of International Application PCT/JP2011/006979, filed on Dec. 14, 2011, designating the United States, which claims priority from Japanese Application 2010-293931, filed Dec. 28, 2010, which are hereby incorporated herein by reference in their entirety.

TECHNICAL FIELD

The present invention relates to an aromatic hydrocarbon resin that can be used as electrical insulating material; resist resin; semiconductor sealing resin; adhesive for a printed circuit board; matrix resin for an electrical laminated plate mounted in an electric device, electronic device, industrial device, and the like; matrix resin for a prepreg mounted in an electric device, electronic device, industrial device, and the like; material for a build-up laminated plate; resin for fiber reinforced plastic; sealing resin for a liquid crystal display panel; paint material; various kinds of coating materials; adhesive; coating material for semiconductors; or resist resin used in semiconductor manufacture. The present invention also relates to an underlayer film forming composition for lithography that is effective in a multilayer resist process used in microfabrication during the manufacturing process of semiconducting device and the like, and to a method for forming a photoresist pattern using the underlayer film forming composition for lithography.

BACKGROUND ART

Reacting a phenol with formaldehyde in the presence of an acidic catalyst is generally known as a reaction for manufacturing phenolic novolak resin and the like. On the other hand, manufacturing polyphenol (Japanese Patent Publication No. H06-001741 A) or novolak resin (Japanese Patent Publication No. 2004-511584 A) by reacting aldehydes, such as acetaldehyde, propionaldehyde, isobutyraldehyde, crotonaldehyde, or benzaldehyde, has also been demonstrated.

It is known that novolak resin can be manufactured by reacting hydroxybenzaldehyde or the like, which has the properties of both a phenol and an aldehyde (Japanese Patent Publication No. 2008-088197 A).

These polyphenols and novolak resin are used as coating agents or resist resins for semiconductors. One desired property for such uses is heat resistance. It is generally known that heat resistance can be improved by enhancing the carbon concentration in resin. One method for enhancing the carbon concentration and reducing the oxygen concentration is to introduce an aromatic hydrocarbon component. One such known component is a polymer (acenaphthene resin) having the structure shown by the following formula (Japanese Patent Publication No. 2000-143937 A).

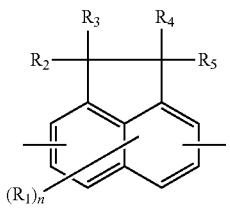

In the formula, $R_1$ is a monovalent atom or group, n is an integer from 0 to 4, and $R_2$ through $R_5$ are either independent hydroxy groups or are monovalent atoms or groups.

Such materials, however, have problems such as being expensive, requiring strict reaction conditions in order to obtain resin, or involving many, complex reaction processes.

On the other hand, in the manufacture of semiconductor devices, microfabrication is performed via lithography using a photoresist composition. In recent years, along with a shift to high integration and high speed of LSIs, demand has increased for further refinement by pattern rules. However, within lithography by light exposure, which is a general technique at present, an inherent limit is being reached on the resolution derived from the wavelength of the light source.

As the light source for lithography used during resist pattern formation, a transition is being made to a shorter wavelength, from a KrF excimer laser (248 nm) to an ArF excimer laser (193 nm). As refinement of the resist pattern proceeds, however, the problem of resolution or the problem of the resist pattern collapsing after development occurs, leading to a desire for a resist with a thinner film. In this case, it becomes difficult to obtain a film thickness of the resist pattern sufficient for substrate processing, thereby requiring a process to allow not only the resist pattern but also a resist underlayer film, which is formed between the resist and the semiconductor substrate to be processed, to function as a mask during substrate processing. Currently, as the resist underlayer film for such a process, there is demand for a resist underlayer film for lithography having a dry etching speed selectivity near that of the resist, a resist underlayer film for lithography having a dry etching speed selectivity smaller than that of the resist, and a resist underlayer film for lithography having a dry etching speed selectivity smaller than that of the semiconductor substrate, unlike a conventional resist underlayer film with a high etching speed. (For example, see Japanese Patent Publication No. 2004-177668 A, Japanese Patent Publication No. 2004-271838 A, and Japanese Patent Publication No. 2005-250434 A.)

By virtue of having high etching resistance, a material with high carbon concentration is considered effective, and as such a material, an amorphous carbon underlayer film formed from CVD using material such as methane gas, ethane gas, acetylene gas, or the like is well known. From the perspective of processing, however, there is a demand for an underlayer film material that can be formed by spin-coating.

Furthermore, the present inventors have proposed an underlayer film forming composition consisting of a naphthalene formaldehyde polymer as material with high etching resistance and high solvent solubility (see International Publication No. WO 2009-072465 A). There is a demand for improvement, however, with respect to etching resistance with the technique in International Publication No. WO 2009-072465A.

Therefore, there is a desire for the development of a technique that can maintain the balance between etching resistance and solvent solubility to a higher degree.

Therefore, there is a desire for the development of a technique that can maintain the balance between etching resistance and solvent solubility to a higher degree.

SUMMARY OF INVENTION

It is an object of the present invention to provide an aromatic hydrocarbon resin that can be used as electrical insulating material; resist resin; semiconductor sealing resin; adhesive for a printed circuit board; matrix resin for an electrical laminated plate mounted in an electric device, electronic device, industrial device, and the like; matrix resin for a prepreg mounted in an electric device, electronic device, industrial device, and the like; material for a build-up laminated plate; resin for fiber reinforced plastic; sealing resin for a liquid crystal display panel; paint composition; various kinds of coating materials; adhesive; coating material for semiconductors; or resist resin for semiconductors, that has a high carbon concentration, and that has excellent etching resistance while also having high solvent solubility.

It is another object of the present invention to provide, as an underlayer film for a multilayer resist, a composition for forming a novel photoresist underlayer film with excellent etching resistance, an underlayer film with high etching resistance formed from the composition, and a method for forming a pattern using the underlayer film.

[1] An aromatic hydrocarbon resin according to the present invention is obtained by reacting an aromatic hydrocarbon represented by formula (1), an aldehyde represented by formula (2), and a phenol derivative represented by formula (3) in the presence of an acidic catalyst.

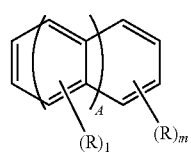
(1)

In formula (1), R represents hydrogen or an alkyl group having 1 to 4 carbon atoms; l and m each represent a number from 1 to 3; A represents a number from 0 to 2; and plural groups represented by R are the same or different from each other.

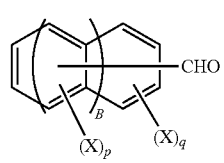
(2)

In formula (2), X represents hydrogen, an alkyl group having 1 to 10 carbon atoms, an aryl group having 6 to 10 carbon atoms, a cyclohexyl group, a hydroxyl group, a formyl group, or a carbonyl group; p and q each represent a number from 1 to 3; B represents a number from 0 to 2; and plural groups represented by X are the same or different from each other.

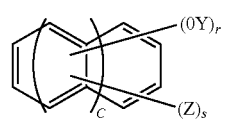
(3)

In formula (3), Y and Z represent hydrogen, an alkyl group having 1 to 10 carbon atoms, an aryl group having 6 to 10 carbon atoms, or a cyclohexyl group; r and s each represent a number from 1 to 10; C represents a number from 0 to 2; and plural groups represented by Y and Z are the same or different from each other.

[2] An underlayer film forming composition for lithography according to the present invention is a composition for forming an underlayer film between a substrate and a resist layer and comprises at least the aromatic hydrocarbon resin according to [1] and an organic solvent.

[3] An underlayer film for lithography according to the present invention is formed from the underlayer film forming composition for lithography according to [2].

[4] A method for forming a multilayer resist pattern according to the present invention comprises the steps of forming an underlayer film on a substrate using the underlayer film forming composition of [2], forming at least one photoresist layer on the underlayer film, subsequently forming a resist pattern by irradiating a predetermined region of the photoresist layer and developing the photoresist layer with an alkali, and subsequently transferring the resist pattern to the underlayer film by etching the underlayer film with plasma including at least oxygen gas while using the resist pattern as a mask.

The aromatic hydrocarbon resin of the present invention has a high carbon concentration and therefore is useful as an electrical insulating material; resist resin; semiconductor sealing resin; adhesive for a printed circuit board; matrix resin for an electrical laminated plate mounted in an electric device, electronic device, industrial device, and the like; matrix resin for a prepreg mounted in an electric device, electronic device, industrial device, and the like; material for a build-up laminated plate; resin for fiber reinforced plastic; sealing resin for a liquid crystal display panel; paint composition; various kinds of coating materials; adhesive; coating material for semiconductors; or resist resin for semiconductors.

Furthermore, by using the underlayer film forming composition for lithography according to the present invention, an underlayer film with excellent etching resistance to oxygen plasma etching and the like can be formed, and an excellent resist pattern can be obtained by using the underlayer film.

DESCRIPTION OF THE EMBODIMENTS

Aromatic Hydrocarbon Resin

The present invention relates to an aromatic hydrocarbon resin obtained by reacting an aromatic hydrocarbon represented by formula (1), an aldehyde represented by formula (2), and a phenol derivative represented by formula (3) in the presence of an acidic catalyst. Specifically, the aromatic hydrocarbon resin of the present invention is constituted by a polymer obtained by reacting the aromatic hydrocarbon represented by formula (1), the aldehyde represented by formula (2), and the phenol derivative represented by formula (3) in the presence of an acidic catalyst.

The mole ratio when reacting the aromatic hydrocarbon represented by formula (1), the aldehyde represented by formula (2), and the phenol derivative represented by formula (3) in the presence of an acidic catalyst is a ratio of aromatic hydrocarbon+phenol derivative:aldehyde of 1:0.1 to 1:6, preferably 1:0.3 to 1:6, more preferably 1:0.5 to 1:6, even more preferably 1:0.5 to 1:4, and particularly preferably 1:0.5 to 1:2. Setting the mole ratio of the aromatic hydrocarbon represented by formula (1), the aldehyde represented by formula (2), and the phenol derivative represented by formula (3) to be within the above ranges allows for the resin yield of the obtained aromatic hydrocarbon resin to be maintained relatively high and to reduce the amount of unreacted material that remains.

Furthermore, the mole ratio of the aromatic hydrocarbon represented by formula (1) and the phenol derivative represented by formula (3) is 1:0.1 to 1:10, preferably 1:0.2 to 1:5.

The condensation reaction between the aromatic hydrocarbon represented by formula (1), the aldehyde represented by formula (2), and the phenol derivative represented by formula (3) is performed in the presence of an acidic catalyst, at normal pressure, while heating to reflux at or above the temperature (normally 80 to 250° C.) at which the material and the denaturing agent being used are dissolved in each other, or while distilling off produced water and the like. As necessary, the condensation reaction may be performed under pressure.

Furthermore, as necessary, an inactive solvent may be used in the condensation reaction. Such a solvent may, for example, be a saturated aliphatic hydrocarbon, such as heptane or hexane; an alicyclic hydrocarbon, such as cyclohexane; an ether, such as dioxane or dibutyl ether; an alcohol, such as 2-propanol; a ketone, such as methyl isobutyl ketone; or a carboxylic acid, such as acetate.

The acidic catalyst that can be used in the above condensation reaction may be selected from among known inorganic acids and organic acids. Examples include mineral acids such as hydrochloric acid, sulfuric acid, or phosphoric acid; organic acids such as oxalic acid, citric acid, formic acid, p-toluenesulfonic acid, methanesulfonic acid, trifluoroacetic acid, trifluoromethanesulfonic acid, benzenesulfonic acid, naphthalenesulfonic acid, or naphthalenedisulfonic acid; Lewis acids such as zinc chloride, aluminum chloride, ferric chloride, or borontrifluoride; and solid acids such as silicotungstic acid, phosphotungstic acid, silicomolybdic acid, and phosphomolybdic acid. From a manufacturing perspective, however, p-toluenesulfonic acid, methanesulfonic acid, trifluoromethanesulfonic acid, benzenesulfonic acid, naphthalenesulfonic acid, naphthalenedisulfonic acid, and phosphotungstic acid are preferable.

The amount of acidic catalyst used is adjusted so that per total 100 parts by mass, the total amount of the aromatic hydrocarbon represented by formula (1), the aldehyde represented by formula (2), and the phenol derivative represented by formula (3) is from 0.01 to 100 parts by mass, preferably from 0.01 to 20 parts by mass, and more preferably from 0.1 to 10 parts by mass. By setting the amount of catalyst to be in this range, an appropriate reaction rate is obtained, and the resin can be prevented from reaching a high viscosity due to an even higher reaction rate.

A reaction time of 1 to 10 hours is preferable, with a time of approximately 2 to 8 hours being more preferable. Setting such a reaction time yields modified resin with the targeted properties in an economical and industrially advantageous manner.

After the reaction, the solvent is further added as necessary for dilution. The product is left to stand for biphasic separation into a resin phase, which is an oil phase, and a water phase. The acidic catalyst is then completely removed by washing with water, and the added solvent and unreacted denaturing agent are removed with a general technique such as distillation, thereby yielding the modified resin.

The polymer constituting the aromatic hydrocarbon resin of the present invention preferably at least has the structure represented by formula (4) below.

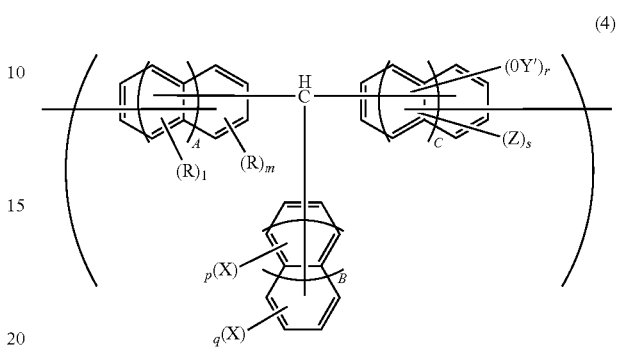

In formula (4), R, X, Z, l, m, p, q, r, s, A, B, and C are all the same as in formulae (1), (2), and (3), and Y' is the same as Y in formula (3) or is a single bond forming a direct bond with R, X, Y, Z, or an aromatic ring in the resin.

Examples of the aromatic hydrocarbon represented by formula (1) include benzene, toluene, xylene, trimethylbenzene, naphthalene, methylnaphthalene, dimethylnaphthalene, anthracene, and the like. Any one of these, or a combination of two or more, may be used. In the present invention, from the overall perspective of an advantage in obtaining materials, ease of manufacturing resin, etching resistivity, and the like, xylene, trimethylbenzene, naphthalene, methylnaphthalene, dimethylnaphthalene, and anthracene are preferable, naphthalene, methylnaphthalene, dimethylnaphthalene, and anthracene are more preferable, and naphthalene, methylnaphthalene, and dimethylnaphthalene are particularly preferable.

Examples of the aldehyde represented by formula (2) include benzaldehyde, methylbenzaldehyde, ethylbenzaldehyde, propylbenzaldehyde, butylbenzaldehyde, cyclohexylbenzaldehyde, biphenylaldehyde, hydroxybenzaldehyde, dihydroxybenzaldehyde, naphthaldehyde, hydroxynaphthaldehyde, anthracenealdehyde, and the like. Any one of these, or a combination of two or more, may be used.

Furthermore, formaldehyde may be used in combination.

Examples of the phenol derivative represented by formula (3) include phenol, catechol, resorcinol, hydroquinone, cresol, ethylphenol, propylphenol, butylphenol, methylcatechol, methylresorcinol, methylhydroquinone, anisole, naphthol, methylnaphthol, dihydroxynaphthalene, methyldihydroxynaphthalene, methoxynaphthalene, anthracenemonool, anthracenediol, anthracenetriol, anthracenetetrol, and the like. Any one of these, or a combination of two or more, may be used.

The carbon concentration in the aromatic hydrocarbon resin of the present invention or the polymer that constitutes the aromatic hydrocarbon resin (hereinafter also referred to as "aromatic hydrocarbon resin (polymer)") is preferably from 80 to 99.9 mass %, more preferably from 85 to 99.9 mass %, and even more preferably from 90 to 99.9 mass %. Setting the carbon concentration to be in the above ranges satisfactorily achieves the required heat resistance.

Furthermore, the oxygen concentration in the aromatic hydrocarbon resin (polymer) of the present invention is preferably from 0 to 10 mass %, more preferably from 0 to 5 mass %, even more preferably from 0 to 3 mass %, and most preferably from 0 to 1 mass %. A value of 10 mass % or less satisfactorily achieves the required heat resistance.

Note that the carbon concentration and the oxygen concentration indicate the mass % of carbon and oxygen, respectively, included in the aromatic hydrocarbon resin (polymer).

The molecular weight of the aromatic hydrocarbon resin (polymer) of the present invention is not limited. If the weight average molecular weight (Mw) exceeds 50,000, however, viscosity is too high, and when using the resin, spin-coating may be impossible. The Mw is preferably from 800 to 10,000, more preferably from 1,000 to 10,000, even more preferably from 1,000 to 5,000, and most preferably from 2,000 to 5,000. Within the above ranges, solubility is excellent, as are heat resistance and outgassing reduction.

From the perspective, for example, of suppressing metallic contamination for use in electronic materials, the residual metal content of the aromatic hydrocarbon resin (polymer) is preferably 1000 ppb by mass or less, more preferably 100 ppb by mass or less, and particularly preferably 50 ppb by mass or less. The method for reducing the residual metal content is not particularly limited, and examples include a method to wash the resin solution in ultrapure water or the like and a method to bring the resin solution into contact with an ion-exchange resin.

In the polymer, an epoxide group can be introduced into the phenolic hydroxyl so as to harden the resin and reduce outgassing. A resin including phenolic hydroxyl may be reacted with a compound containing epoxy, such as epichlorohydrin, in order to introduce an epoxide group through the action of a base.

[Underlayer Film Forming Composition for Lithography]

The underlayer film forming composition for lithography according to the present invention is a composition for forming an underlayer film between a substrate and a resist layer and includes at least the above-described aromatic hydrocarbon resin and an organic solvent. Specifically, the aromatic hydrocarbon resin is constituted by a polymer obtained by reacting the aromatic hydrocarbon represented by formula (1), the aldehyde represented by formula (2), and the phenol derivative represented by formula (3) in the presence of an acidic catalyst.

The underlayer film forming composition for lithography according to the present invention preferably includes, per 100 parts by mass of the composition including the organic solvent, 1 to 33 parts by mass of the aromatic hydrocarbon resin (polymer) of the present invention and more preferably includes 2 to 25 parts by mass.

In order to suppress intermixing in the underlayer film forming composition for lithography according to the present invention, a crosslinking agent and an acid generator may be blended therein.

Specific examples of the crosslinking agent that can be used in the present invention include a melamine compound substituted by at least one group selected from a methylol group, an alkoxymethyl group, and an acyloxymethyl group, a guanamine compound, a glycoluril compound or a urea compound, an epoxy compound, a thioepoxy compound, an isocyanate compound, an azide compound, and a compound having a double bond, such as an alkenyl ether group. These may be used as an additive, or these crosslinking groups may be introduced into a polymer side chain as a pendant group. A compound including a hydroxy group may also be used as a crosslinking agent.

Among the above compounds, examples of epoxy compounds include tris(2,3-epoxypropyl)isocyanurate, trimethylolmethane triglycidylether, trimethylolpropane triglycidylether, triethylolethane triglycidylether, and the like. Specific examples of melamine compounds include hexamethylol melamine, hexamethoxymethyl melamine, a compound in which 1 to 6 methylol groups of hexamethylol melamine are methoxymethylated or a mixture thereof, hexamethoxyethyl melamine, hexasiloxymethyl melamine, and a compound in which 1 to 6 methylol groups of hexamethylolmelamine are acyloxymethylated or a mixture thereof.

Examples of guanamine compounds include tetramethylolguanamine, tetramethoxymethylguanamine, a compound in which 1 to 4 methylol groups of tetramethylolguanamine are methoxymethylated or a mixture thereof, tetramethoxyethylguanamine, tetraacyloxyguanamine, and a compound in which 1 to 4 methylol groups of tetramethylolguanamine are acyloxymethylated or a mixture thereof. Examples of glycoluril compounds include tetramethylolglycoluril, tetramethoxyglylcoluril, tetramethoxymethylglycoluril, a compound in which 1 to 4 methylol groups of tetramethylolglycoluril are methoxymethylated or a mixture thereof, and a compound in which 1 to 4 methylol groups of tetramethylolglycoluril are acyloxymethylated or a mixture thereof. Examples of urea compounds include tetramethylolurea, tetramethoxymethylurea, a compound in which 1 to 4 methylol groups of tetramethylolurea are methoxymethylated or a mixture thereof, tetramethoxyethylurea, and the like.

Examples of a compound containing an alkenyl ether group include ethylene glycol divinyl ether, triethylene glycol divinyl ether, 1,2-propanediol divinyl ether, 1,4-butanediol divinyl ether, tetramethylene glycol divinyl ether, neopenthyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, trimethylol propane trivinyl ether, and the like.

The blending amount of the crosslinking agent in the present invention is preferably 5 to 50 parts (by mass; hereinafter the same) and particularly preferably 10 to 40 parts by mass per 100 parts of the aromatic hydrocarbon resin (polymer). An amount of less than 5 parts may cause mixing with the resist, whereas an amount exceeding 50 parts may decrease the anti-reflection effect or lead to cracks in the crosslinked film.

In the present invention, an acid generator may be blended to further accelerate the crosslinking reaction by heat. Acid generators include those that generate acid by thermal decomposition and those that generate acid by light irradiation, and either may be used.

Examples of the acid generator used in the present invention include the following:
1) onium salt of the following general formula (P1a-1), (P1a-2), (P1a-3) or (P1b),
2) diazomethane derivative of the following general formula (P2),
3) glyoxime derivative of the following general formula (P3),
4) bissulfonate derivative of the following general formula (P4),
5) sulfonic acid ester of N-hydroxyimide compound of the following general formula (P5),
6) β-ketosulfonic acid derivative,
7) disulfone derivative,
8) nitrobenzylsulfonate derivative,
9) sulfonic acid ester derivative,
and the like.

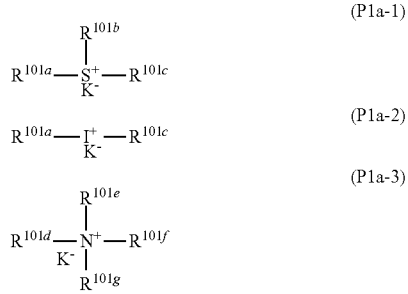

In the above formulae, $R^{101a}$, $R^{101b}$ and $R^{101c}$ each represent a linear, branched, or cyclic alkyl, alkenyl, oxoalkyl or oxoalkenyl group having 1 to 12 carbon atoms, an aryl group having 6 to 20 carbon atoms, or an aralkyl or aryloxoalkyl group having 7 to 12 carbon atoms, and a part or all of hydrogen atoms in these groups may be substituted by an alkoxy group or the like. Also, $R^{101b}$ and $R^{101c}$ may form a ring, and if they form a ring, $R^{101b}$ and $R^{101c}$ each represent an alkylene group having 1 to 6 carbon atoms. $K^-$ represents a non-nucleophillic counter ion. $R^{101d}$, $R^{101e}$, $R^{101f}$ and $R^{101g}$ are represented by adding a hydrogen atom to $R^{101a}$, $R^{101b}$ and $R^{101c}$. $R^{101d}$ and $R^{101e}$, and $R^{101d}$, $R^{101e}$ and $R^{101f}$ may form a ring, and if they form a ring, $R^{101d}$ and $R^{101e}$ and $R^{101d}$, $R_{101e}$ and $R^{101f}$ represent an alkylene group having 3 to 10 carbon atoms. Alternatively, they may represent a heteroaromatic ring having a nitrogen atom of the formula in its ring.

$R^{101a}$, $R^{101b}$, $R^{101c}$, $R^{101d}$, $R^{101e}$, $R^{101f}$ and $R^{101g}$ may be the same or different from each other. Specifically, as the alkyl group, examples include a methyl group, ethyl group, propyl group, isopropyl group, n-butyl group, sec-butyl group, tert-butyl group, pentyl group, hexyl group, heptyl group, octyl group, cyclopentyl group, cyclohexyl group, cycloheptyl group, cyclopropylmethyl group, 4-methylcyclohexyl group, cyclohexylmethyl group, norbornyl group, adamantyl group, and the like. As the alkenyl group, vinyl group, allyl group, propenyl group, butenyl group, hexenyl group, cyclohexenyl group, and the like. As the oxoalkyl group, examples include 2-oxocyclopentyl group, 2-oxocyclohexyl group, and the like, as well as a 2-oxopropyl group, 2-cyclopentyl-2-oxoethyl group, 2-cyclohexyl-2-oxoethyl group, 2-(4-methylcyclohexyl)-2-oxoethyl group, and the like. As the aryl group, examples include a phenyl group, naphthyl group, and the like, alkoxyphenyl groups such as p-methoxyphenyl group, m-methoxyphenyl group, o-methoxyphenyl group, ethoxyphenyl group, p-tert-butoxyphenyl group, m-tert-butoxyphenyl group, and the like, alkyl phenyl groups such as 2-methylphenyl group, 3-methylphenyl group, 4-methylphenyl group, ethylphenyl group, 4-tert-butylphenyl group, 4-butylphenyl group, dimethylphenyl group, and the like, alkylnaphthyl groups such as methylnaphthyl group, ethylnaphthyl group, and the like, alkoxynaphthyl groups such as methoxynaphthyl group, ethoxynaphthyl group, and the like, dialkylnaphthyl groups such as dimethylnaphthyl group, diethylnaphthyl group, and the like, and dialkoxynaphthyl groups such as dimethoxynaphthyl group, diethoxynaphthyl group, and the like. As the aralkyl group, examples include a benzyl group, phenylethyl group, phenethyl group, and the like. As the aryloxoalkyl group, examples include 2-aryl-2-oxoethyl groups such as a 2-phenyl-2-oxoethyl group, 2-(1-naphthyl)-2-oxoethyl group, 2-(2-naphthyl)-2-oxoethyl group, and the like. As the non-nucleophillic counter ion of $K^-$, examples include halide ions such as a chloride ion, bromide ion, and the like, fluoroalkylsulfonates such as triflate, 1,1,1-trifluoroethansulfonate, nonafluorobutanesulfonate, and the like, arylsulfonates such as tosylate, benzenesulfonate, 4-fluorobenzenesulfonate, 1,2,3,4,5-pentafluorobenzenesulfonate, and the like, and alkylsulfonates such as mesylate, butanesulfonate, and the like.

Also, the heteroaromatic ring in which $R^{101d}$, $R^{101e}$, $R^{101f}$ and $R^{101g}$ have a nitrogen atom of the formula in its ring is exemplified by imidazole derivatives (for example, imidazole, 4-methylimidazole, 4-methyl-2-phenylimidazole, and the like), pyrazole derivatives, furazan derivatives, pyrroline derivatives (for example, pyrroline, 2-methyl-1-pyrroline, and the like), pyrrolidine derivatives (for example, pyrrolidine, N-methylpyrrolidine, pyrrolidinone, N-methylpyrrolidone, and the like), imidazoline derivatives, imidazolidine derivatives, pyridine derivatives (for example, pyridine, methylpyridine, ethylpyridine, propylprydine, butylprydine, 4-(1-butylpentyl)pyridine, dimethylprydine, trimethylprydine, triethylprydine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, dimethylaminopyridine, and the like), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (for example, quinoline, 3-quinolinecarbonitrile, and the like), isoquinoline derivatives, cinnoline derivatives, quinazoline derivatives, quinoxalline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, uridine derivatives and so on.

The general formula (P1a-1) and the general formula (P1a-2) have the effects of both a photoacid generator and a thermal acid generator, while the general formula (P1a-3) acts as a thermal acid generator.

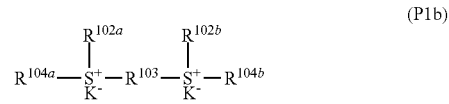

In the formula (P1b), $R^{102a}$ and $R^{102b}$ each represent a linear, branched or cyclic alkyl group having 1 to 8 carbon atoms. $R^{103}$ represents a linear, branched or cyclic alkylene group having 1 to 10 carbon atoms. $R^{104a}$ and $R^{104b}$ each represent a 2-oxoalkyl group having 3 to 7 carbon atoms. $K^-$ represents a non-nucleophillic counter ion.

As $R^{102a}$ and $R^{102b}$, specific examples include a methyl group, ethyl group, propyl group, isopropyl group, n-butyl group, sec-butyl group, tert-butyl group, pentyl group, hexyl group, heptyl group, octyl group, cyclopentyl group, cyclohexyl group, cyclopropylmethyl group, 4-methylcyclohexyl group, cyclohexylmethyl group, and the like. As $R^{103}$, examples include a methylene group, ethylene group, propylene group, butylene group, pentylene group, hexylene group, heptylene group, octylene group, nonylene group, 1,4-cyclohexylene group, 1,2-cyclohexylene group, 1,3-cyclopentylene group, 1,4-cyclooctylene group, 1,4-cyclohexanedimethylene group, and the like. Examples of $R^{104a}$ and $R^{104b}$ include a 2-oxopropyl group, 2-oxocyclopentyl group, 2-oxoxcyclohexyl group, 2-oxocycloheptyl group, and the like. K⁻ can include the same as explained for the formulae (P1a-1), (P1a-2) and (P1a-3).

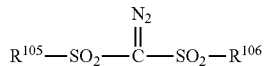
(P2)

In the formula (P2), $R^{105}$ and $R^{106}$ represent a linear, branched or cyclic alkyl or halogenated alkyl group having 1 to 12 carbon atoms, an aryl or halogenated aryl group having 6 to 20 carbon atoms, or an aralkyl group having 7 to 12 carbon atoms.

As the alkyl group of $R^{105}$ and $R^{106}$, examples include a methyl group, ethyl group, propyl group, isopropyl group, n-butyl group, sec-butyl group, tert-butyl group, pentyl group, hexyl group, heptyl group, octyl group, amyl group, cyclopentyl group, cyclohexyl group, cycloheptyl group, norbornyl group, adamantyl group, and the like. As the halogenated alkyl group, examples include a trifluoromethyl group, 1,1,1-trifluoroethyl group, 1,1,1-trichloroethyl group, nonafluorobutyl group, and the like. As the aryl group, examples include a phenyl group, alkoxyphenyl groups such as a p-methoxyphenyl group, m-methoxyphenyl group, o-methoxyphenyl group, ethoxyphenyl group, p-tert-butoxyphenyl group, m-tert-butoxyphenyl group, and the like, and alkylphenyl groups such as a 2-methylphenyl group, 3-methylphenyl group, 4-methylphenyl group, ethylphenyl group, 4-tert-butylphenyl group, 4-butylphenyl group, dimethylphenyl group, and the like. As the halogenated aryl group, examples include a fluorophenyl group, chlorophenyl group, 1,2,3,4,5-pentafluorophenyl group, and the like. As the aralkyl group, examples include a benzyl group, phenethyl group, and the like.

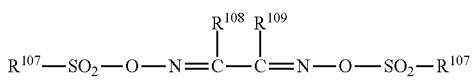
(P3)

In the formula (P3), $R^{107}$, $R^{108}$ and $R^{109}$ represent a linear, branched or cyclic alkyl or halogenated alkyl group having 1 to 12 carbon atoms, an aryl or halogenated aryl group having 6 to 20 carbon atoms, or an aralkyl group having 7 to 12 carbon atoms. $R^{108}$ and $R^{109}$ may bind with each other to form a cyclic structure, and if they form a cyclic structure, $R^{108}$ and $R^{109}$ each represent a linear or branched alkylene group having 1 to 6 carbon atoms.

As the alkyl, halogenated alkyl, aryl, halogenated aryl and aralkyl groups of $R^{107}$, $R^{108}$ and $R^{109}$, examples include the same groups as explained for $R^{105}$ and $R^{106}$. In addition, as the alkylene group of $R^{108}$ and $R^{109}$, examples include a methylene group, ethylene group, propylene group, butylene group, hexylene group, and the like.

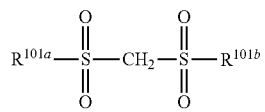
(P4)

In the formula (P4), $R^{101a}$ and $R^{101b}$ are the same as described above.

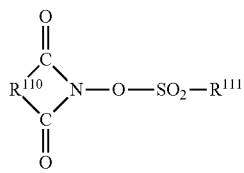
(P5)

In the formula (P5), $R^{110}$ represents an arylene group having 6 to 10 carbon atoms, an alkylene group having 1 to 6 carbon atoms, or an alkenylene group having 2 to 6 carbon atoms, and a part or all of hydrogen atoms of these groups may be further substituted by a linear or branched alkyl or alkoxy group having 1 to 4 carbon atoms, a nitro group, an acetyl group or a phenyl group. $R^{111}$ represents a linear, branched or substituted alkyl, alkenyl or alkoxyalkyl group having 1 to 8 carbon atoms, a phenyl group, or a naphthyl group, and a part or all of hydrogen atoms of these groups may be further substituted by an alkyl or alkoxy group having 1 to 4 carbon atoms; a phenyl group which may be substituted by an alkyl group, alkoxy group, nitro group or acetyl group having 1 to 4 carbon atoms; a heteroaromatic group having 3 to 5 carbon atoms; or a chlorine atom or fluorine atom.

Herein, as the arylene group of $R^{110}$, examples include a 1,2-phenylene group, 1,8-naphthylene group, and the like, as the alkylene group of $R^{110}$, examples include a methylene group, ethylene group, trimethylene group, tetramethylene group, phenylethylene group, norbornane-2,3-diyl group, and the like, and as the alkenylene group of $R^{110}$, examples include a 1,2-vinylene group, 1-phenyl-1,2-vinylene group, 5-norbornene-2,3-diyl group, and the like. As the alkyl group of $R^{111}$, examples are the same as those of $R^{101a}$ to $R^{101c}$, as the alkenyl group of $R^{111}$, examples include a vinyl group, 1-propenyl group, allyl group, 1-butenyl group, 3-butenyl group, isoprenyl group, 1-pentenyl group, 3-pentenyl group, 4-pentenyl group, dimethyl allyl group, 1-hexenyl group, 3-hexenyl group, 5-hexenyl group, 1-heptenyl group, 3-heptenyl group, 6-heptenyl group, 7-octenyl group, and the like, and as the alkoxyalkyl group of $R^{111}$, examples include a methoxymethyl group, ethoxymethyl group, propoxymethyl group, butoxymethyl group, pentyloxymethyl group, hexyloxymethyl group, heptyloxymethyl group, methoxyethyl group, ethoxyethyl group, propoxyethyl group, butoxyethyl group, pentyloxyethyl group, hexyloxyethyl group, methoxypropyl group, ethoxypropyl group, propoxypropyl group, butoxypropyl group, methoxybutyl group, ethoxybutyl group, propoxybutyl group, methoxypentyl group, ethoxypentyl group, methoxyhexyl group, methoxyheptyl group, and the like.

In addition, as the alkyl group having 1 to 4 carbon atoms by which a part or all of the hydrogen atoms of $R^{110}$ and $R^{111}$ may be further substituted, examples include a methyl group, ethyl group, propyl group, isopropyl group, n-butyl group, isobutyl group, tert-butyl group, and the like. As the alkoxy group having 1 to 4 carbon atoms by which a part or all of the hydrogen atoms of $R^{110}$ and $R^{111}$ may be further substituted, examples include a methoxy group, ethoxy group, propoxy group, isopropoxy group, n-butoxy group, isobutoxy group, tert-butoxy group, and the like. As the phenyl group which may be substituted by an alkyl group, alkoxy group, nitro group or acetyl group having 1 to 4 carbon atoms, examples include a phenyl group, tolyl group, p-tert-butoxyphenyl group, p-acethylphenyl group, p-nitrophenyl group, and the like. As the heteroaromatic group having 3 to 5 carbon atoms, examples include a pyridyl group, furyl group, and the like.

Specifically, included are, for example, onium salts such as tetramethylammonium trifluoromethanesulfonate, tetramethylammonium nonafluorobutanesulfonate, triethylammonium nonafluorobutanesulfonate, pyridinium nonafluorobutanesulfonate, triethylammonium camphersulfonate, pyridinium camphersulfonate, tetra-n-butylammonium nonafluorobutanesulfonate, tetraphenylammonium nonafluorobutanesulfonate, tetramethylammonium p-toluenesulfonate, diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylenebis[methyl(2-oxocyclopentyl)sulfonium trifluoromethanesulfonate], 1,2'-naphthylcarbonylmethyltetrahydrothiophenium triflate, and the like, diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobuthylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, 1-tert-amylsulfonyl-1-(tert-butylsulfonyl)diazomethane, and the like, glyoxime derivatives such as bis-(p-toluenesulfonyl)-α-dimethylglyoxime, bis-(p-toluenesulfonyl)-α-diphenylglyoxime, bis-(p-toluenesulfonyl)-α-dicyclohexylglyoxime, bis-(p-toluenesulfonyl)-α-2,3-pentanedionglyoxime, bis-(p-toluenesulfonyl)-2-methyl-3,4-pentanedionglyoxime, bis-(n-butanesulfonyl)-α-dimethylglyoxime, bis-(n-butanesulfonyl)-α-diphenylglyoxime, bis-(n-butanesulfonyl)-α-dicyclohexylglyoxime, bis-(n-butanesulfonyl)-2,3-pentanedionglyoxime, bis-(n-butanesulfonyl)-2-methyl-3,4-pentanedionglyoxime, bis-(methanesulfonyl)-α-dimethylglyoxime, bis-(trifluoromethanesulfonyl)-α-dimethylglyoxime, bis-(1,1,1-trifluoroethanesulfonyl)-α-dimethylglyoxime, bis-(tert-butanesulfonyl)-α-dimethylglyoxime, bis-(perfluorooctanesulfonyl)-α-dimethylglyoxime, bis-(cyclohexanesulfonyl)-α-dimethylglyoxime, bis-(benzenesulfonyl)-α-dimethylglyoxime, bis-(p-fluorobenzenesulfonyl)-α-dimethylglyoxime, bis-(p-tert-butylbenzenesulfonyl)-α-dimethylglyoxime, bis-(xylenesulfonyl)-α-dimethylglyoxime, bis-(camphersulfonyl)-α-dimethylglyoxime, and the like, bissulfone derivatives such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, bisbenzenesulfonylmethane, and the like, β-ketosulfone derivatives such as 2-cyclohexylcarbonyl-2-(p-toluenesulfonyl)propane, 2-isopropylcarbonyl-2-(p-toluenesulfonyl)propane, and the like, disulfone derivatives such as diphenyldisulfone derivatives, dicyclohexyldisulfone derivatives, and the like, nitrobenzylsulfonate derivatives such as 2,6-dinitrobenzyl p-toluenesulfonate, 2,4-dinitrobenzyl p-toluenesulfonate, and the like, sulfonic acid ester derivatives such as 1,2,3-tris(methanesulfonyloxy)benzene, 1,2,3-tris(trifluoromethanesulfonyloxy)benzene, 1,2,3-tris(p-toluenesulfonyloxy)benzene, and the like; sulfonic acid ester derivatives of N-hydroxyimide compounds, such as N-hydroxysuccinimide methanesulfonic acid ester, N-hydroxysuccinimide trifluoromethanesulfonic acid ester, N-hydroxysuccinimide ethanesulfonic acid ester, N-hydroxysuccinimide 1-propanesulfonic acid ester, N-hydroxysuccinimide 2-propanesulfonic acid ester, N-hydroxysuccinimide 1-pentanesulfonic acid ester, N-hydroxysuccinimide 1-octanesulfonic acid ester, N-hydroxysuccinimide p-toluenesulfonic acid ester, N-hydroxysuccinimide p-methoxybenzenesulfonic acid ester, N-hydroxysuccinimide 2-chloroethanesulfonic acid ester, N-hydroxysuccinimide benzenesulfonic acid ester, N-hydroxysuccinimide-2,4,6-trimethylbenzenesulfonic acid ester, N-hydroxysuccinimide 1-naphthalenesulfonic acid ester, N-hydroxysuccinimide 2-naphthalenesulfonic acid ester, N-hydroxy-2-phenylsuccinimide methanesulfonic acid ester, N-hydroxymaleimide methanesulfonic acid ester, N-hydroxymaleimide ethanesulfonic acid ester, N-hydroxy-2-phenylmaleimide methanesulfonic acid ester, N-hydroxyglutarimide methanesulfonic acid ester, N-hydroxyglutarimide benzenesulfonic acid ester, N-hydroxyphthalimide methanesulfonic acid ester, N-hydroxyphthalimide benzenesulfonic acid ester, N-hydroxyphthalimide trifluoromethanesulfonic acid ester, N-hydroxyphthalimide p-toluenesulfonic acid ester, N-hydroxynaphthalimide methanesulfonic acid ester, N-hydroxynaphthalimide benzenesulfonic acid ester, N-hydroxy-5-norbornene-2,3-dicarboxylmide methanesulfonic acid ester, N-hydroxy-5-norbornene-2,3-dicarboxylmide trifluoromethanesulfonic acid ester, N-hydroxy-5-norbornene-2,3-dicarboxylmide p-toluenesulfonic acid ester, and the like. Particularly, onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, 1,2'-naphthylcarbonylmethyltetrahydrothiophenium triflate, and the like, diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobuthylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, and the like, glyoxime derivatives such as bis-(p-toluenesulfonyl)-α-dimethylglyoxime, bis-(n-butanesulfonyl)-α-dimethylglyoxime, and the like, bissulfone derivatives such as bisnaphthylsulfonylmethane, and the like, and sulfonic acid ester derivatives of N-hydroxyimide compounds, such as N-hydroxysuccinimide methanesulfonic acid ester, N-hydroxysuccinimide trifluoromethanesulfonic acid ester, N-hydroxysuccinimide 1-propanesulfonic acid ester, N-hydroxysuccinimide 2-propanesulfonic acid ester, N-hydroxysuccinimide 1-pentanesulfonic acid ester, N-hydroxysuccinimide p-toluenesulfonic acid ester, N-hydroxynaphthalimide methanesulfonic acid ester, N-hydroxynaphthalimide benzenesulfonic acid ester, and the like are preferably used.

Any one or a combination of two or more of the above acid generators may be used. The additive amount of the acid generator is preferably 0.1 to 50 parts by mass and more preferably 0.5 to 40 parts by mass per 100 parts by mass of the aromatic hydrocarbon resin (polymer). If the amount is less than 0.1 part by mass, the generated amount of acid is low, and the crosslinking reaction may be insufficient, whereas if the amount exceeds 50 parts by mass, a mixing phenomenon may be caused by acid transferring to the upper layer resist.

Furthermore, a basic compound to improve the storage stability can be blended into the underlayer film forming composition for lithography according to the present invention.

The basic compound serves as an acid quencher in order to prevent a minute amount of acid generated by the acid generator from furthering the crosslinking reaction. As such basic compounds, examples include primary, secondary and tertiary aliphatic amines, hybrid amines, aromatic amines, heterocyclic amines, nitrogen-containing compounds having a carboxy group, nitrogen-containing compounds having a sulfonyl group, nitrogen-containing compounds having a hydroxyl group, nitrogen-containing compounds having a hydroxyphenyl group, alcoholic nitrogen-containing compounds, amide derivatives, imide derivatives, and the like.

The primary aliphatic amines are specifically exemplified by ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, tetraethylenepentamine, and the like. The secondary aliphatic amines are specifically exemplified by dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, N,N-dimethyltetraethylenepentamine, and the like. The tertialy aliphatic amines are specifically exemplified by trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, N,N,N',N'-tetramethyltetraethylenepentamine, and the like.

Also, the hybrid amines are exemplified by dimethylethylamine, methylethylpropylamine, benzylamine, phenethylamine, benzyldimethylamine, and the like. Specific examples of the aromatic amines and heterocyclic amines include aniline derivatives (for example, aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, N,N-dimethyltoluidine, and the like), diphenyl(p-tolyl)amine, methyldiphenylamine, triphenylamine, phenylenediamine, naphthylamine, diaminonaphthalene, pyrrole derivatives (for example, pyrrole, 2H-pyrrole, 1-methylpyrrole, 2,4-dimethylpyrrole, 2,5-dimethylpyrrole, N-methylpyrrole, and the like), oxazole derivatives (for example, oxazole, isooxazole, and the like), thiazole derivatives (for example, thiazole, isothiazole, and the like), imidazole derivatives (for example, imidazole, 4-methylimidazole, 4-methyl-2-phenylimidazole, and the like), pyrazole derivatives, furazan derivatives, pyrroline derivatives (for example, pyrroline, 2-methyl-1-pyrroline, and the like), pyrrolidine derivatives (for example, pyrrolidine, N-methylpyrrolidine, pyrrolidinone, N-methylpyrrolidone, and the like), imidazoline derivatives, imidazolidine derivatives, pyridine derivatives (for example, pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, dimethylaminopyridine, and the like), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (for example, quinoline, 3-quinolinecarbonitrile, and the like), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, uridine derivatives, and the like.

Furthermore, the nitrogen-containing compound having a carboxy group is exemplified by aminobenzoic acid, indole carboxylic acid, aminoacid derivatives (for example, nicotine acid, alanine, arginine, asparagine acid, glutamine acid, glycine, histidine, isoleucine, glycylleucine, leucine, methionine, phenylalanine, threonine, lysine, 3-aminopyrazine-2-carboxylic acid, methoxyalanine) and the like. The nitrogen-containing compound having a sulfonyl group is exemplified by 3-pyrridinesulfonic acid and pyridinium p-toluenesulfonate. The nitrogen-containing compound having a hydroxyl group, the nitrogen-containing compound having a hydroxyphenyl group, and the alcoholic nitrogen-containing compound are exemplified by 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, N-(2-hydroxyethyl) isonicotinamide, and the like. The amide derivative is exemplified by formamide, N-methylformamide, N,N- dimethylformamide, acetoamide, N-methylacetoamide, N,N-dimethylacetoamide, propioneamide, benzamide, and the like. The imide derivative is exemplified by phthalimide, succinimide, maleimide, and the like.

The blending amount of the basic compound is preferably 0.001 to 2 parts by mass, and particularly preferably 0.01 to 1 part by mass, per 100 parts by mass of the aromatic hydrocarbon resin (polymer). If the blending amount is less than 0.001 part by mass, no blending effect is achieved, and if the blending amount is more than 2 parts by mass, all acid generated by heat may be trapped, thereby preventing crosslinking.

Another resin and/or compound can be blended with the underlayer film forming composition for lithography according to the present invention for the purpose of imparting thermosetting properties or controlling absorbance. Examples include resins that have high transparency at 193 nm, such as a naphthol resin, xylene resin-based naphthol modified resin, naphthalene resin-based phenol modified resin, polyhydroxystyrene, dicyclopentadiene resin, resin containing (meth)acrylate, dimethacrylate, trimethacrylate, tetramethacrylate, a naphthalene ring such as vinylnaphthalene or polyacenaphthylene, a biphenyl ring such as phenanthrenequinone or fluorene, or a heterocyclic ring having a hetero atom such as thiophene or indene, or a resin containing no aromatic ring; and a resin or a compound that contains an alicyclic structure, such as a rosin resin, cyclodextrin, adamantine(poly)ol, tricyclodecane(poly)ol, or a derivative of these.

The organic solvent that can be used in the underlayer film forming composition for lithography according to the present invention is not particularly limited, as long as the above polymer, polyphenol compound, cyclic organic compound, acid generator, crosslinking agent, other additives and the like are soluble therein.

Examples include ketone-based solvent such as acetone, methyl ethyl ketone, methyl isobutyl ketone, cyclohexanone, and the like; cellosolve-based solvent such as propylene glycol monomethyl ether, propylene glycol monomethyl ether acetate, and the like; ester-based solvent such as ethyl lactate, methyl acetate, ethyl acetate, butyl acetate, isoamyl acetate, ethyl lactate, methyl methoxypropionate, methyl hydroxyisobutyrate, and the like; alcohol-based solvent such as methanol, ethanol, isopropanol, 1-ethoxy-2-propanol, and the like; and aromatic hydrocarbons such as toluene, xylene, anisole, and the like.

Among the organic solvents listed above, cyclohexanone, propylene glycol monomethyl ether, propylene glycol monomethyl ether acetate, ethyl lactate, methyl hydroxyisobutyrate, and anisole are particularly preferable from the perspective of safety.

The blending amount of the organic solvent is preferably 200 to 10,000 parts and particularly preferably 300 to 5,000 parts per 100 parts of the aromatic hydrocarbon resin (polymer) from the perspectives of solubility and film formation.

[Underlayer Film for Lithography]

The underlayer film for lithography according to the present invention is formed from the above-described underlayer film forming composition for lithography.

In the method for forming an underlayer film according to the present invention, it is desirable to perform baking after spin coating in order to volatilize the organic solvent, to prevent mixing with the upper layer resist and to accelerate the crosslinking reaction. The baking temperature is preferably in a range of 80 to 450° C. and particularly preferably in a range of 200 to 400° C. The baking time is preferably in a range of 10 to 300 seconds. Although the thickness of the underlayer film is selected as needed, the thickness is preferably from 30 to 20,000 nm, and particularly preferably from 50 to 15,000 nm. After the underlayer film is made, in a two-layers process, a silicon-containing resist layer or a conventional monolayer resist composed of hydrocarbon is made on the underlayer film, and in a three-layers process, a silica-containing intermediate layer is made on the underlayer film and a monolayer resist layer is further made on thereon. In this case, a well-known photoresist composition may be used for forming the resist layer.

As a silicon-containing resist composition for a two-layers process, a silicon atom-containing polymer such as a polysilsesquioxane derivative, vinylsilane derivative, or the like is used as a base polymer from the perspective of oxygen gas etching resistance, and furthermore, a positive-type photoresist composition comprising the organic solvent, the acid generator, and as necessary a basic compound and the like is used. As the silicon atom-containing polymer, a well-known polymer used in this kind of resist composition can be used.

As a silicon-containing intermediate layer for a three-layers process, a polysilsesquioxane-based intermediate layer is preferably used. By causing the intermediate layer to have the effect of an antireflection coating, reflection can be suppressed.

If a material that contains many aromatic groups and is high in substrate etching resistance is used as an underlayer film for exposure to radiation at 193 nm, the k value becomes high and the substrate reflection increases, whereas the substrate reflection can be made 0.5% or less by suppressing reflection with the intermediate layer.

As the intermediate layer having an anti-reflection effect, polysilsesquioxane, which introduces a light absorption group containing a phenyl group or silicon-silicon bond and is crosslinked with an acid or heat, is preferably used for exposure to radiation at 193 nm, yet the intermediate layer is not particularly limited.

An intermediate layer formed with a Chemical Vapour Deposition (CVD) process can also be used. An SiON film is known as an intermediate layer formed with a CVD process and highly effective as an anti-reflection coating. The formation of an intermediate layer with a spin-coating process is easier and costs less than formation with a CVD process. The upper layer resist in a three-layer process may be either a positive-type or a negative-type, and the same monolayer resist as used conventionally can be used.

The underlayer film according to the present invention can be also used as an anti-reflection coating for a conventional monolayer resist. Because the underlayer film according to the present invention has excellent etching resistance for substrate processing, it can be also expected to function as a hard mask for substrate processing.

[Method for Forming Multilayer Resist Pattern]

The method for forming a multilayer resist pattern according to the present invention comprises the steps of forming an underlayer film on a substrate using the above-described underlayer film forming composition, forming at least one photoresist layer on the underlayer film, subsequently forming a resist pattern by irradiating a predetermined region of the photoresist layer and developing the photoresist layer with an alkali, and subsequently transferring the resist pattern to the underlayer film by etching the underlayer film with plasma including at least oxygen gas while using the resist pattern as a mask.

When a resist layer is formed with the photoresist composition, a spin coating process is preferably used, as when forming the underlayer film. After spin coating the resist composition, prebaking is conducted, preferably at a range of 80 to 180° C. for 10 to 300 seconds. Subsequently, the resist layer is exposed to radiation, subjected to post-exposure baking (PEB), and developed according to ordinary methods, thereby obtaining the resist pattern. The thickness of the resist film is not particularly limited yet is preferably from 30 to 500 nm, and particularly preferably from 50 to 400 nm.

Examples of exposure light are high energy lines with a wavelength of 300 nm or less, specifically excimer lasers of 248 nm, 193 nm or 157 nm, soft X-rays of 3 to 20 nm, electron beams, X-rays, and the like.

Next, the obtained resist pattern is used as a mask for etching. For etching of the underlayer film in a two-layer process, etching is performed using oxygen gas. An inert gas such as He, Ar, or the like, or CO, $CO_2$, $NH_3$, $SO_2$, $N_2$, $NO_2$ or $H_2$ gas may also be added in addition to oxygen gas. Alternatively, etching can be conducted with only CO, $CO_2$, $NH_3$, $N_2$, $NO_2$ or $H_2$ gas without using oxygen gas. In particular, the latter gases are used for sidewall protection to prevent an undercut in the pattern sidewall. For the etching of the intermediate layer in a three-layer process, the intermediate layer is processed with a Freon gas, using the resist pattern as a mask. Next, the oxygen gas etching is conducted, and the underlayer film is processed using the intermediate pattern as a mask.

The subsequent etching of the workpiece substrate can be performed according to an ordinary method, and for example, if the substrate is $SiO_2$ or SiN, etching is performed mainly using a Freon gas, and if the substrate is p-Si, Al or W, etching is performed mainly using a chlorine-based or bromine-based gas. When the substrate is processed by etching with a Freon gas, the silicon-containing resist in a two-layer process and the silicon-containing intermediate layer in a three-layer process are stripped at the same time as the substrate processing. When a substrate is etched with a chlorine-based or bromine-based gas, it is necessary to separately conduct dry-etching stripping with a Freon gas after the substrate processing for stripping of the silicon-containing resist layer or silicon-containing intermediate layer.

The underlayer film according to the present invention characteristically has excellent resistance to etching of these workpiece substrates.

Note that the workpiece substrate may be formed on a substrate. The substrate is not particularly limited, and a material different from that of the workpiece film (workpiece substrate) may be used, such as Si, α-Si, p-Si, $SiO_2$, SiN, SiON, W, TiN, Al, and the like. As the workpiece film, a variety of Low-k films and stopper films thereof may be used, such as Si, $SiO_2$, SiON, SiN, p-Si, α-Si, W, W—Si, Al, Cu, Al—Si, and the like. These films can be formed into a regular thickness of 50 to 10,000 nm, and particularly 100 to 5,000 nm.

EXAMPLES

The present invention will now be described in greater detail through examples, but the present invention is in no way limited to these examples.

Carbon/Oxygen Concentration in Aromatic Hydrocarbon Resin

The carbon/oxygen concentration (mass %) in the aromatic hydrocarbon aldehyde resin was measured by organic elementary analysis.

Device: CHN coder MT-6 (produced by Yanaco Analysis Industries, Ltd.)

Molecular Weight

Through gel permeation chromatography (GPC), the polystyrene-converted weight average molecular weight (Mw), number average molecular weight (Mn), and degree of dispersion (Mw/Mn) were calculated.

Device: Shodex GPC-101 (produced by Showa Denko K.K.)

Column: LF-804×3

Eluent: THF 1 ml/min

Temperature: 40° C.

Example 1

In a 1 L volumetric four-necked flask equipped with a Dimroth condenser, a thermometer, and stirring blades, 71 g (0.5 mol) of 1-methylnaphthalene (produced by Kanto Chemical Co. Inc.), 182 g (1.0 mol) of biphenylaldehyde (produced by Mitsubishi Gas Chemical Company, Inc.), and 70 g (0.5 mol) of 1-naphthol (produced by Acros Organics) were placed under a nitrogen stream, and 3 ml of methanesulfonic acid (produced by Kanto Chemical Co. Inc.) were added once every hour a total of 6 times. The reaction mixture was heated to 220° C. and reacted for 6 hours. After dilution with 400 g of methyl isobutyl ketone (produced by Kanto Chemical Co. Inc.) and 200 g of anisole (produced by Kanto Chemical Co. Inc.), the reaction mixture was neutralized and washed with water, and the solvents were removed under reduced pressure, thereby providing 166 g of resin (NF-1). The results of GPC analysis were Mn: 929, Mw: 1518, and Mw/Mn: 1.63. The results of organic elementary analysis were a carbon concentration of 91.7 mass % and an oxygen concentration of 3.0 mass %.

The resin obtained in Example 1 was soluble (solubility: 10 mass %) in propylene glycol monomethyl ether acetate.

Example 2

In a 1 L volumetric four-necked flask equipped with a Dimroth condenser, a thermometer, and stirring blades, 64 g (0.5 mol) of naphthalene (produced by Kanto Chemical Co. Inc.), 182 g (1.0 mol) of biphenylaldehyde (produced by Mitsubishi Gas Chemical Company, Inc.), and 72 g (0.5 mol) of 1-naphthol (produced by Acros Organics) were placed under a nitrogen stream, and 3 ml of methanesulfonic acid were added once every hour a total of 6 times. The reaction mixture was heated to 220° C. and reacted for 6 hours. After dilution with 400 g of methyl isobutyl ketone (produced by Kanto Chemical Co. Inc.) and 200 g of anisole (produced by Kanto Chemical Co. Inc.), the reaction mixture was neutralized and washed with water, and the solvents were removed under reduced pressure to yield 200 g of resin (NF-2). The results of GPC analysis were Mn: 835, Mw: 1332, and Mw/Mn: 1.60. The results of organic elementary analysis were a carbon concentration of 91.4 mass % and an oxygen concentration of 3.2 mass %.

The resin obtained in Example 2 was soluble (solubility: 10 mass %) in propylene glycol monomethyl ether acetate.

Example 3

In a 1 L volumetric four-necked flask equipped with a Dimroth condenser, a thermometer, and stirring blades, 64 g (0.5 mol) of naphthalene (produced by Kanto Chemical Co. Inc.), 182 g (1.0 mol) of biphenylaldehyde (produced by Mitsubishi Gas Chemical Company, Inc.), and 72 g (0.5 mol) of 1-naphthol (produced by Acros Organics) were placed under a nitrogen stream, and the reaction mixture was reacted for a total of 16 hours: 10 hours at 160° C., 4 hours at 180° C., and 2 hours at 200° C. During the reaction, 1.92 g of citric acid (produced by Kanto Chemical Co. Inc.) was added a total of 10 times: 6 times at 160° C. once per hour, and 4 times at 180° C. every 30 minutes. After dilution with 600 g of methyl isobutyl ketone (produced by Kanto Chemical Co. Inc.), the reaction mixture was neutralized and washed with water, and the solvents were removed under reduced pressure to yield 149 g of resin (NF-3). The results of GPC analysis were Mn: 606, Mw: 862, and Mw/Mn: 1.42. The results of organic elementary analysis were a carbon concentration of 89.5 mass % and an oxygen concentration of 5.4 mass %.

The resin obtained in Example 3 was soluble (solubility: 10 mass %) in propylene glycol monomethyl ether acetate.

Example 4

In a 1 L volumetric four-necked flask equipped with a Dimroth condenser, a thermometer, and stirring blades, 64 g (0.5 mol) of naphthalene (produced by Kanto Chemical Co. Inc.), 182 g (1.0 mol) of biphenylaldehyde (produced by Mitsubishi Gas Chemical Company, Inc.), and 72 g (0.5 mol) of 1-naphthol (produced by Acros Organics) were placed under a nitrogen stream, and the reaction mixture was reacted for a total of 16 hours: 10 hours at 160° C., 4 hours at 180° C., and 2 hours at 200° C. During the reaction, 1.26 g of oxalic acid dihydrate (produced by Kanto Chemical Co. Inc.) was added a total of 10 times: 6 times at 160° C. once per hour, and 4 times at 180° C. every 30 minutes. After dilution with 600 g of methyl isobutyl ketone (produced by Kanto Chemical Co. Inc.), the reaction mixture was neutralized and washed with water, and the solvents were removed under reduced pressure to yield 122 g of resin (NF-4). The results of GPC analysis were Mn: 594, Mw: 847, and Mw/Mn: 1.43. The results of organic elementary analysis were a carbon concentration of 89.8 mass % and an oxygen concentration of 5.1 mass %.

The resin obtained in Example 4 was soluble (solubility: 10 mass %) in propylene glycol monomethyl ether acetate.

Example 5

In a 1 L volumetric four-necked flask equipped with a Dimroth condenser, a thermometer, and stirring blades, 38 g (0.3 mol) of naphthalene (produced by Kanto Chemical Co. Inc.), 206 g (1.0 mol) of 9-anthracenecarboxaldehyde (produced by Kanto Chemical Co. Inc.), and 101 g (0.7 mol) of 1-naphthol (produced by Acros Organics) were placed under a nitrogen stream, and 3 ml of methanesulfonic acid were added once every hour a total of 6 times. The reaction mixture was heated to 230° C. and reacted for 6 hours. After dilution with 400 g of methyl isobutyl ketone (produced by Kanto Chemical Co. Inc.) and 200 g of anisole (produced by Kanto Chemical Co. Inc.), the reaction mixture was neutralized and washed with water, and the solvents were removed under reduced pressure to yield 140 g of resin (NF-5). The results of GPC analysis were Mn: 854, Mw: 1251, and Mw/Mn: 1.46. The results of organic elementary analysis were a carbon concentration of 91.4 mass % and an oxygen concentration of 4.1 mass %.

The resin obtained in Example 5 was soluble (solubility: 10 mass %) in propylene glycol monomethyl ether acetate.

Example 6

In a 1 L volumetric four-necked flask equipped with a Dimroth condenser, a thermometer, and stirring blades, 89 g (0.5 mol) of anthracene (produced by Kanto Chemical Co. Inc.), 182 g (1.0 mol) of biphenylaldehyde (produced by Mitsubishi Gas Chemical Company, Inc.), and 121 g (0.5 mol) of 1,4,9,10-anthracenetetrol (produced by Kanto Chemical Co. Inc.) were placed under a nitrogen stream, and 3 ml of methanesulfonic acid were added once every hour a total of 6 times. The reaction mixture was heated to 240° C. and reacted for 8 hours. After dilution with 400 g of methyl isobutyl ketone (produced by Kanto Chemical Co. Inc.) and 200 g of anisole (produced by Kanto Chemical Co. Inc.), the reaction mixture was neutralized and washed with water, and the solvents were removed under reduced pressure to yield 156 g of resin (NF-6). The results of GPC analysis were Mn: 821, Mw: 1354, and Mw/Mn: 1.65. The results of organic elementary analysis were a carbon concentration of 92.1 mass % and an oxygen concentration of 3.2 mass %.

The resin obtained in Example 6 was soluble (solubility: 10 mass %) in propylene glycol monomethyl ether acetate.

Assessment of Resin

The results for Examples 1 to 6 show that the aromatic hydrocarbon resin yielded by reacting the aromatic hydrocarbon represented by formula (1), the aldehyde represented by formula (2), and the phenol derivative represented by formula (3) in the presence of an acidic catalyst has a high carbon concentration and has a solubility of 10 mass % in propylene glycol monomethyl ether acetate.

Production Example 1

Production of Dimethylnaphthalene Formaldehyde Resin

In a 10 L volumetric four-necked flask having a removable bottom and equipped with a Dimroth condenser, a thermometer, and stirring blades, 1.09 kg (7 mol) of 1,5-dimethylnaphthalene (produced by Mitsubishi Gas Chemical Company, Inc.), 2.1 kg of 40 mass % formalin aqueous solution (28 mol of formaldehyde, produced by Mitsubishi Gas Chemical Company, Inc.), and 0.97 kg of 98 mass % sulfuric acid (produced by Kanto Chemical Co. Inc.) were placed under a nitrogen stream. The reaction mixture was reacted for 7 hours under reflux at ordinary pressure and a temperature of 100° C. As a diluting solvent, 1.8 kg of ethylbenzene (guaranteed reagent, produced by Wako Pure Chemical Industries, Ltd.) was added, and after allowing to stand, the aqueous phase as the lower phase was removed. The reaction mixture was then neutralized and washed with water, and the ethylbenzene and unreacted 1,5-dimethylnaphthalene were distilled off under reduced pressure to yield 1.25 kg of light brown solid dimethylnaphthalene formaldehyde resin.

The results of GPC measurement were Mn: 562, Mw: 1168, and Mw/Mn: 2.08. The results of organic elementary analysis were a carbon concentration of 84.2 mass % and an oxygen concentration of 8.3 mass %.

The obtained dimethylnaphthalene formaldehyde resin was not soluble in propylene glycol monomethyl ether acetate at 10 mass %.

Production Example 2

In a 0.5 L volumetric four-necked flask equipped with a Dimroth condenser, a thermometer, and stirring blades, 100 g (0.51 mol) of the dimethylnaphthalene formaldehyde resin obtained in Production Example 1 were placed under a nitrogen stream, and 0.05 g of paratoluene sulfonic acid were added. The reaction mixture was heated to 190° C., and after heating for 2 hours, the reaction mixture was stirred. Subsequently, 52.0 g (0.36 mol) of 1-naphthol were added, and after further heating to 220° C., the reaction mixture was reacted for 2 hours. After solvent dilution, the reaction mixture was neutralized and washed with water, and the solvent was removed under reduced pressure to yield 126.1 g of dark brown solid modified resin (CR-1).

The results of GPC analysis were Mn: 885, Mw: 2220, and Mw/Mn: 4.17. The results of organic elementary analysis were a carbon concentration of 89.1 mass % and an oxygen concentration of 4.5 mass %.

The obtained resin was soluble in propylene glycol monomethyl ether acetate at 10 mass %.

Examples 7-12, Comparative Example 1

Underlayer film forming compositions with the formulations listed in Table 1 were prepared. Next, underlayer film forming solutions were spin-coated on a silicon substrate, baked at 240° C. for 60 seconds, and further baked at 400° C. for 120 seconds to yield an underlayer film with a thickness of 200 nm. An etching test was performed under the following conditions. Table 1 shows the results. As reference material, an underlayer film was obtained with novolak under the same conditions and subjected to the etching test.
Etching apparatus: RIE-10NR produced by Samco International, Inc.
Output: 50 W
Pressure: 20 Pa
Time: 2 min
Etching Gas:
Ar gas flow rate: $CF_4$ gas flow rate: $O_2$ gas flow rate=50:5:5 (sccm)
Etching Resistance Assessment
A: etching rate of −10% or less as compared to novolak
B: etching rate of more than −10% and −5% or less as compared to novolak
C: etching rate of more than −5% and 0% or less as compared to novolak
D: etching rate of more than 0% and +10% or less as compared to novolak
E: etching rate of more than +10% as compared to novolak

TABLE 1

| | Resin, compound (parts by mass) | Organic Solvent (parts by mass) | Etching Resistance |
|---|---|---|---|
| Example 7 | NF-1 (10) | CHN (90) | A |
| Example 8 | NF-2 (10) | CHN (90) | A |
| Example 9 | NF-3 (10) | CHN (90) | A |
| Example 10 | NF-4 (10) | CHN (90) | A |
| Example 11 | NF-5 (10) | CHN (90) | A |
| Example 12 | NF-6 (10) | CHN (90) | A |
| Comparative Example 1 | CR-1 (10) | CHN (90) | C |

Acid generator: di-tertiary-butyldiphenyliodonium nonafluoromethanesulfonate (DTDPI) produced by Midori Kagaku Co., Ltd. Crosslinking agent: Nikalac MX270 (Nikalac), produced by Sanwa Chemical Co., Ltd.
Organic solvent: propylene glycol monomethyl ether acetate (PGMEA), cyclohexanone (CHN)
Novolak: PSM4357, produced by Gunei Chemical Industry Co., Ltd.

Example 13

Next, a solution of the underlayer film forming composition (Example 7) was coated on a $SiO_2$ substrate having a thickness of 300 nm, baked at 240° C. for 60 seconds, and further baked at 400° C. for 120 seconds, thereby forming an underlayer film with a thickness of 80 nm. A resist solution for ArF was coated thereon and baked at 130° C. for 60 seconds, thereby forming a photoresist layer having a thickness of 150 nm. The resist solution for ArF was prepared by mixing 5 parts by mass of the compound of formula (5) below, 1 part by mass of triphenylsulfonium nonafluoromethanesulfonate, 2 parts by mass of tributylamine, and 92 parts by mass of PGMEA.

The resist layer was then exposed with an electron beam lithography apparatus (ELS-7500, produced by Elionix, Inc., 50 keV), baked at 115° C. for 90 seconds (PEB), and developed with a 2.38 mass % tetramethylammonium hydroxide (TMAH) aqueous solution for 60 seconds, thereby yielding a positive pattern. The resulting pattern was observed for a pattern shape of 55 mL/S (1:1). Table 2 lists the results.

Comparative Example 2

The same procedures as in Example 13 were performed except that no underlayer film was formed. Table 2 lists the results.

TABLE 2

| | Underlayer Film Forming Composition | Resolution | Sensitivity |
|---|---|---|---|
| Example 13 | Example 7 | 55 nmL/S | 12 μC/cm² |
| Comparative Example 2 | none | 80 nmL/S | 26 μC/cm² |

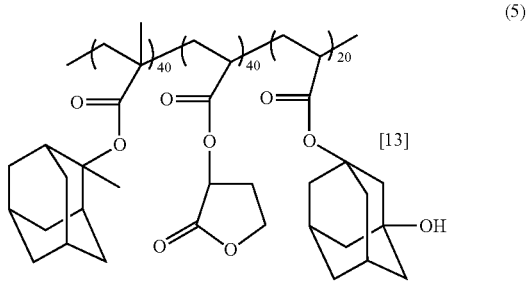

(5)

In formula (5), the numerals 40, 40 and 20 indicate the proportions of the constitutional units and do not indicate a block copolymer.

Next, the resist pattern obtained by the electron beam exposure and development was transferred to the underlayer film under the following conditions. The etching conditions were as follows.
Etching apparatus: RIE-10NR produced by Samco International, Inc.
Output: 50 W
Pressure: 20 Pa
Time: 2 min
Etching Gas:
Ar gas flow rate: $CF_4$ gas flow rate: $O_2$ gas flow rate=50:5:5 (sccm)
Cross sections of the pattern were observed with an electron microscope (S-4800, produced by Hitachi, Ltd.), and the shapes were compared.
Assessment of Resist Pattern It was found that Example 13 using the underlayer film according to the present invention had an excellent shape of the resist after development in the multilayer resist process and shape of the underlayer film after oxygen etching and after etching for processing the substrate, as well as an excellent shape after development in the case of use as a single layer resist hard mask and after etching for processing the substrate.

INDUSTRIAL APPLICABILITY

The aromatic hydrocarbon resin of the present invention is applicable to a wide range of purposes, including electrical insulating material; resist resin; semiconductor sealing resin; adhesive for a printed circuit board; matrix resin for an electrical laminated plate mounted in an electric device, electronic device, industrial device, and the like, and for a prepreg mounted in an electric device, electronic device, industrial device, and the like; material for a build-up laminated plate; resin for fiber reinforced plastic; sealing resin for a liquid crystal display panel; paint composition; various kinds of coating materials; adhesive; coating material for semiconductors; or resist resin for semiconductors.

The invention claimed is:

1. An underlayer film forming composition for lithography, the composition being for forming an underlayer film between a substrate and a resist layer and comprising at least an aromatic hydrocarbon resin and an organic solvent, wherein the aromatic hydrocarbon resin is obtained by reacting an aromatic hydrocarbon represented by formula (1), an aldehyde represented by formula (2), and a phenol derivative represented by formula (3) in the presence of an acidic catalyst:

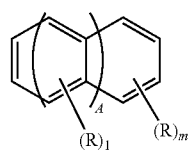
(1)

wherein in formula (1), R represents hydrogen or an alkyl group having 1 to 4 carbon atoms; l and m each represent a number from 1 to 3; A represents a number from 0 to 2; and plural groups represented by R are the same or different from each other;

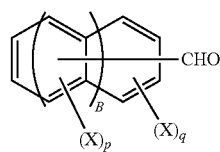
(2)

wherein in formula (2), X represents hydrogen, an alkyl group having 1 to 10 carbon atoms, an aryl group having 6 to 10 carbon atoms, a cyclohexyl group, a hydroxyl group, a formyl group, or a carbonyl group; p and q each represent a number from 1 to 3; B represents a number from 0 to 2; and plural groups represented by X are the same or different from each other; and

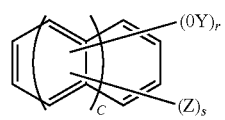
(3)

wherein in formula (3), Y and Z represent hydrogen, an alkyl group having 1 to 10 carbon atoms, an aryl group having 6 to 10 carbon atoms, or a cyclohexyl group; r and s each represent a number from 1 to 10; C represents a number from 0 to 2; and plural groups represented by Y and Z are the same or different from each other.

2. The underlayer film forming composition for lithography according to claim 1, wherein the aromatic hydrocarbon represented by formula (1) is at least one selected from the group consisting of benzene, toluene, xylene, trimethylbenzene, naphthalene, methylnaphthalene, dimethylnaphthalene, and anthracene.

3. The underlayer film forming composition for lithography according to claim 1, wherein the aldehyde represented by formula (2) is at least one selected from the group consisting of benzaldehyde, methylbenzaldehyde, ethylbenzaldehyde, propylbenzaldehyde, butylbenzaldehyde, cyclohexylbenzaldehyde, biphenylaldehyde, hydroxybenzaldehyde, dihydroxybenzaldehyde, naphthaldehyde, hydroxynaphthaldehyde, and anthracenealdehyde.

4. The underlayer film forming composition for lithography according to claim 1, wherein the phenol derivative represented by formula (3) is at least one selected from the group consisting of phenol, catechol, resorcinol, hydroquinone, cresol, ethylphenol, propylphenol, butylphenol, methylcatechol, methylresorcinol, methylhydroquinone, anisole, naphthol, methylnaphthol, dihydroxynaphthalene, methyldihydroxy-naphthalene, methoxynaphthalene, anthracenemonool, anthracenediol, anthracenetriol, and anthracenetetrol.

5. The underlayer film forming composition for lithography according to claim 1, wherein the acidic catalyst is at least one selected from the group consisting of hydrochloric acid, sulfuric acid, phosphoric acid, oxalic acid, citric acid, formic acid, p-toluenesulfonic acid, methanesulfonic acid, trifluoroacetic acid, trifluoromethanesulfonic acid, benzenesulfonic acid, naphthalenesulfonic acid, naphthalenedisulfonic acid, zinc chloride, aluminum chloride, ferric chloride, borontrifluoride, silicotungstic acid, phosphotungstic acid, silicomolybdic acid, and phosphomolybdic acid.

6. The underlayer film forming composition for lithography according to claim 1, wherein the aromatic hydrocarbon resin comprises the structure represented by formula (4):

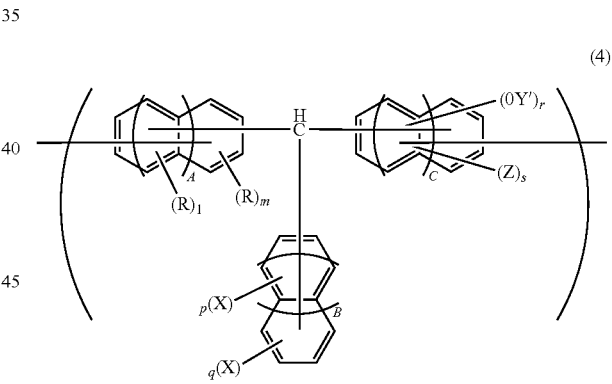
(4)

wherein in formula (4), R, X, Z, l, m, p, q, r, s, A, B, and C are all the same as in formulae (1), (2), and (3), and Y' is the same as Y in formula (3) or is a single bond forming a direct bond with R, X, Y, Z, or an aromatic ring in the resin.

7. The underlayer film forming composition for lithography according to claim 1, wherein the aromatic hydrocarbon resin has a carbon concentration from 80 to 99.9 mass %.

8. The underlayer film forming composition for lithography according to claim 1, wherein the aromatic hydrocarbon resin has a solubility in propylene glycol monomethyl ether acetate of 10 mass % or more.

9. The underlayer film forming composition for lithography according to claim 1, further comprising an acid generator blended therein.

10. The underlayer film forming composition for lithography according to claim 1, further comprising a crosslinking agent blended therein.

11. An underlayer film for lithography formed from the underlayer film forming composition for lithography according to claim 1.

12. A method for forming a multilayer resist pattern comprising the steps of forming an underlayer film on a substrate using the underlayer film forming composition according to claim 1, forming at least one photoresist layer on the underlayer film, subsequently forming a resist pattern by irradiating a predetermined region of the photoresist layer and developing the photoresist layer with an alkali, and subsequently transferring the resist pattern to the underlayer film by etching the underlayer film with plasma including at least oxygen gas while using the resist pattern as a mask.

* * * * *